United States Patent [19]

Sigal

[11] Patent Number: 5,504,441
[45] Date of Patent: Apr. 2, 1996

[54] TWO-PHASE OVERLAPPING CLOCKING TECHNIQUE FOR DIGITAL DYNAMIC CIRCUITS

[75] Inventor: Leon J. Sigal, Monsey, N.Y.

[73] Assignee: International Business Machines Corporation, Armonk, N.Y.

[21] Appl. No.: 293,232

[22] Filed: Aug. 19, 1994

[51] Int. Cl.⁶ .................................................. H03K 19/00
[52] U.S. Cl. .................. 326/93; 326/96; 377/78
[58] Field of Search ................... 326/93, 96, 46; 377/78, 66

[56] References Cited

U.S. PATENT DOCUMENTS

| | | | |
|---|---|---|---|
| 4,687,959 | 8/1987 | Eitrheim | 326/93 |
| 4,745,302 | 5/1988 | Hanawa | 377/78 |
| 4,852,061 | 7/1989 | Baron | 326/96 |
| 5,003,201 | 3/1991 | Bai | 326/93 |
| 5,023,484 | 6/1991 | Pathak et al. | 326/93 |
| 5,289,050 | 2/1994 | Ogasawara | 326/93 |
| 5,321,368 | 6/1994 | Hoelze | 326/93 |

*Primary Examiner*—Edward P. Westin
*Assistant Examiner*—Andrew Sanders
*Attorney, Agent, or Firm*—Robert P. Tassinari, Jr.

[57] ABSTRACT

A digital dynamic circuit is presented which effectively extends the percentage of each clock cycle available for logical operations. The circuit uses a two-phase overlapping clocking design which results in the circuit (1) having only a single latch delay, (2) being insensitive to mid-cycle clock jitter, and (3) being insensitive to the discrete nature of gate delays. Thus, the circuit can better utilize the time available to perform logic.

14 Claims, 11 Drawing Sheets

TWO-PHASE OVERLAPPING CLOCKING TECHNIQUE FOR DIGITAL DYNAMIC CIRCUITS

FIELD OF THE INVENTION

The invention relates to digital dynamic circuits, and in particular to an improved clocking technique for such circuits.

BACKGROUND OF THE INVENTION

Dynamic circuits are known for their speed advantages over static circuits. Dynamic circuits have application in such areas as microprocessor and memory design, as well as in many other areas.

An example of a typical dynamic circuit is shown in FIG. 1 (a CMOS technology example). When 'clock' = '0', transistor P10 conducts and transistor N10 does not conduct. This precharges the dynamic node 'store' to '1'. Node 'output' is driven to '0' by static inverter I10, which comprises transistors P14 and N14. When 'clock' = '1', transistor P10 does not conduct and transistor N10 conducts. If the values of 'input1' ... 'inputN' are such that there exists no conducting path from node 'store' to transistor N10, then node 'store' remains at '1' and node 'output' remains at '0'. If the values of 'input1' ... 'inputN' are such that there exists a conducting path through transistors N11, N12, N13 ... from node 'store' to transistor N10, then node 'store' is discharged to '0', and node 'output' is driven to '1' by static inverter I10. Transistors N11, N12 ... N13, therefore, implement a desired boolean function that determines under what condition node 'output' evaluates to '1'.

FIG. 2 shows a level sensitive latch that can be used with dynamic circuits (a CMOS technology example). When 'clock' is '0', node 'clock_not' is driven to '1' by inverter I20. Transistors P21 and N21 don't conduct, while transistors P20 and N20 conduct. Inverters I21 and I22 form a latch. When 'clock' is '1', node 'clock_not' is driven to '0' by inverter I20. Transistors P20 and N20 don't conduct, while transistors P21 and N21 conduct. Inverters I21 and I22 transfer the value at node 'input' to node 'output'.

The most common way to build a digital system out of dynamic circuits is to use a two-clock clocking scheme, as shown in FIGS. 3 (a) and (b). LOG1s (31 ... 32) are dynamic logic gates controlled by signal 'clock1' in FIG. 3 (b). LOG2s (34 ... 35) are dynamic logic gates controlled by signal 'clock2'. LAT1 (33) is a latch controlled by signal 'clock1'. LAT2s (30 and 36) are latches controlled by signal 'clock2'.

When 'clock1' = '1' and 'clock2' = '0' LOG1s evaluate and their value is written into LAT1s. At the same time, LOG2s precharge and LAT2s hold their data. When 'clock1' = '0' and 'clock2' = '1' LOG1s precharge and LAT1s hold their data; LOG2s evaluate and their value is written into LAT2s.

When 'clock1' = '0' and 'clock2' = '0' no logic is performed by either LOG1 or LOG2. This time is called 'dead time' and is to be avoided. When 'clock1' = '1' and 'clock2' = '1' a condition exists where data from LAT2 30 can propagate through LAT1 33 (via LOG1s) into LAT2 36 (via LOG2s) disturbing uniform data flow. This is called 'race' and is to be avoided.

There are several shortcomings in the two-clock clocking scheme described above. The goal of any design is to maximize the fraction of cycle time during which logic is being performed. In a typical system, the architectured registers can be represented by LAT2s, and the architectured combinational logic split between LOG1s and LOG2s. FIG. 4 shows that time intervals 40 (LAT2 drive time) and 43 (LAT2 setup time) are not available for performing architectured combinational logic because these times are required by the architectured registers LAT2s. Time intervals 41 (LOG1 evaluate time) and 42 (LOG2 evaluate time) are available for performing architectured combinational logic. However, several factors reduce time intervals 41 and 42.

It is necessary to insert LAT1s between LOG1s and LOG2s to hold data when 'clock1' = '0' and 'clock2' = '1', as previously described in FIGS. 3 (a) and (b). When 'clock1' = '0', LOG1s precharge and their outputs go to precharge condition. Thus, LAT1s are required to hold these values for LOG2s.

FIG. 5 shows that time interval 54 is LAT1 setup time and time interval 55 is LAT1 drive time. Time interval 54 reduces time interval 41, leaving time interval 51 for LOG1 evaluation, and time interval 55 reduces time interval 42, leaving time interval 52 for LOG2 evaluation. As a result, less time is available to perform architectured combinational logic.

Typical clocks cannot maintain uniform phase duration without clock jitter. FIG. 6 shows that mid cycle clock jitter 66 further reduces combinational logic time intervals 41 and 42 to time intervals 61 and 62, respectively.

Finally, each dynamic circuit of FIG. 3 (LOG1) has a discrete propagation delay. FIG. 7 shows that it is often not possible to use up the entire time interval 61 with LOG1s of propagation delay 78. As a result, time interval 77 is wasted, since it is not long enough to accommodate another LOG1 delay, leaving only time interval 71. FIG. 7, therefore, illustrates the shortcomings of a two-clock clocking scheme. Time intervals 54, 55, 66, and 77 all reduce time intervals 41 and 42 during which architectured combinational logic is performed.

The invention described below is a novel technique that eliminates undesirable time intervals 54, 55, 66 and 77.

SUMMARY OF THE INVENTION

The present invention overcomes the above-described deficiencies in the prior art by providing a digital dynamic circuit. The circuit includes first and second groups of sequentially arranged logic circuits. A logic-latch circuit is coupled between the output of the first group of logic circuits and the input of the second group of logic circuits. A latch is coupled between the output of the second group of logic circuits and the input of the first group of logic circuits. A first clock signal coupled to provide clock inputs to each of the logic-latch circuits, the first group of logic circuits and the edge-triggered latch, and a second clock signal coupled to provide clock inputs to the second group of logic circuits and logic latch circuits. The system is characterized in that the first and second clock signals overlap.

FIGURES

FIG. 3 (b) is a clock signal diagram depicting the timing of clock signals used in the system of FIG. 3 (b).

FIG. 10 (b) shows the output of the clock circuit of FIG. 10 (a).

FIG. 12 (b) is a timing diagram of the clock inputs to the system of FIG. 12 (a).

Figure 13:
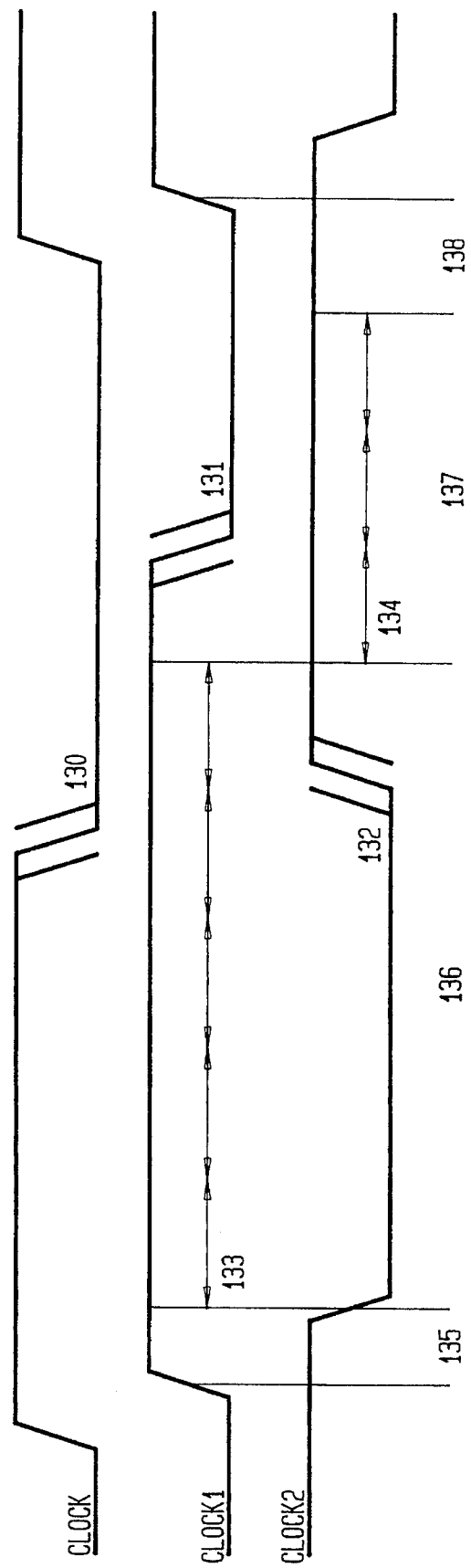

FIG. 13 demonstrates the improved performance of the system of the present invention over that of prior art systems.

Figure 14A:
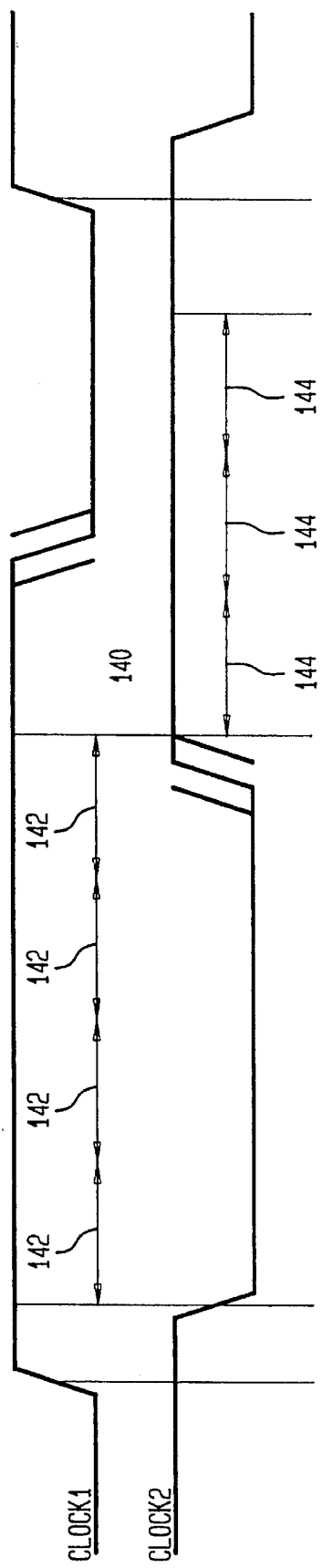
Figure 14B:
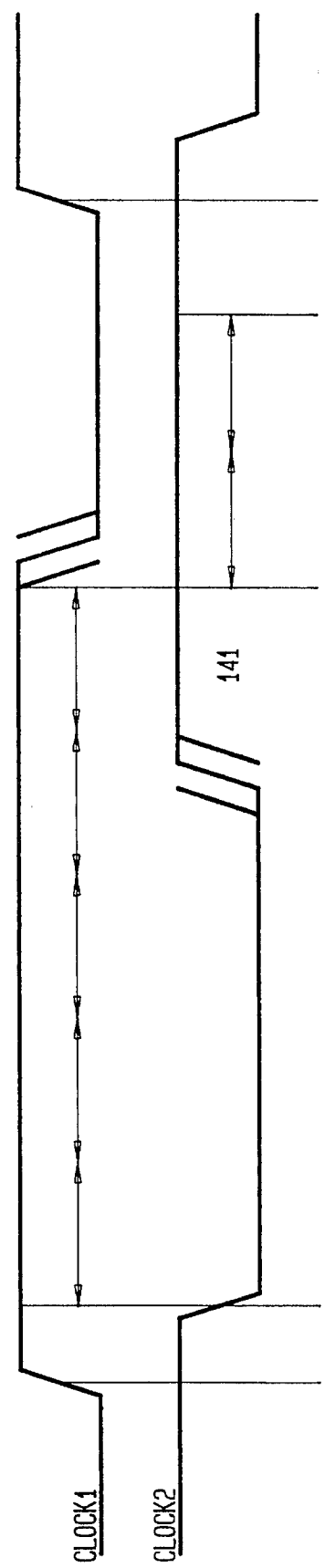

FIGS. 14 (a) and 14 (b) also demonstrate the improved performance of the system of the present invention over that of prior art systems.

DETAILED DESCRIPTION

The present invention is a novel digital dynamic system that is very efficient in utilizing available cycle time to perform architectured combinational logic. The system has three important features.

Figure 3A:
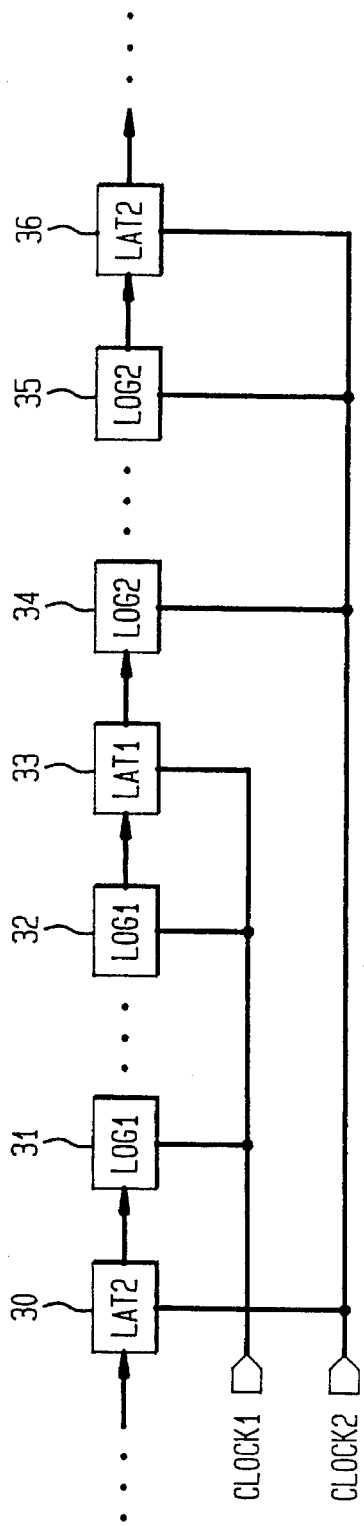
FIG. 3 (a) is a functional block diagram of a digital system constructed from dynamic circuits according to the prior art.
Figure 3B:
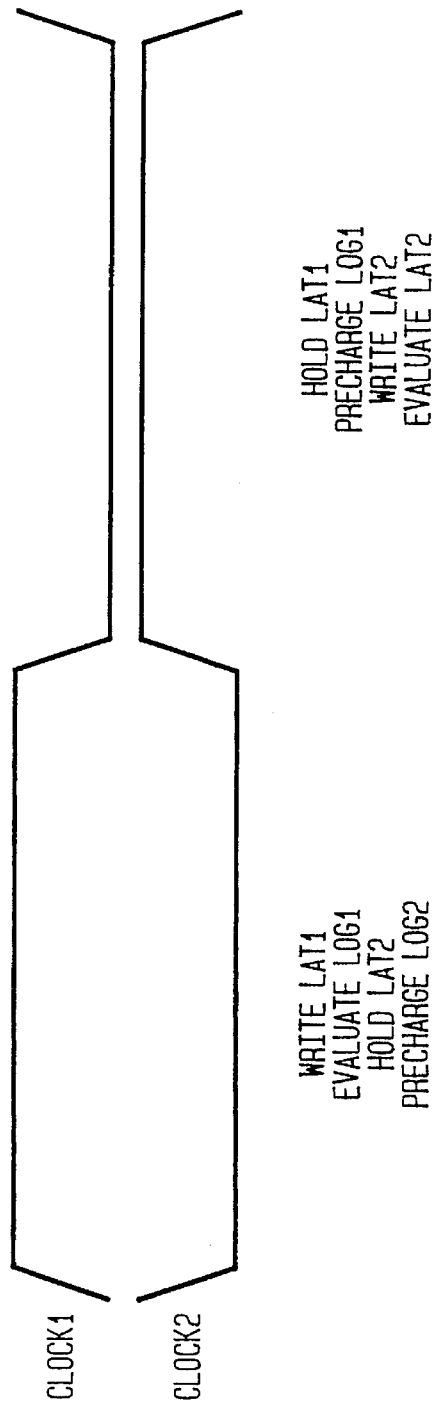
Figure 4:
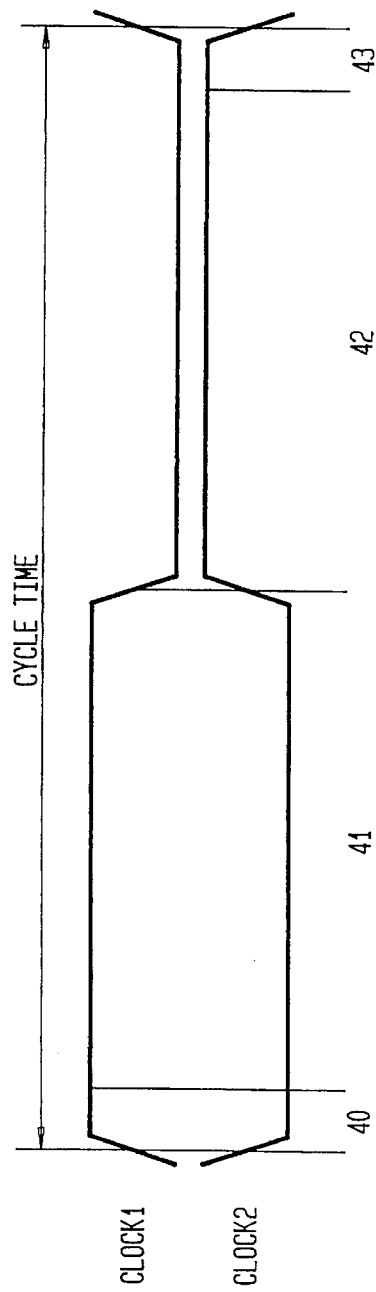
FIG. 4 is clock signal diagram for the system of FIG. 3 (a) which accounts for logic evaluate time delays.
Figure 8:
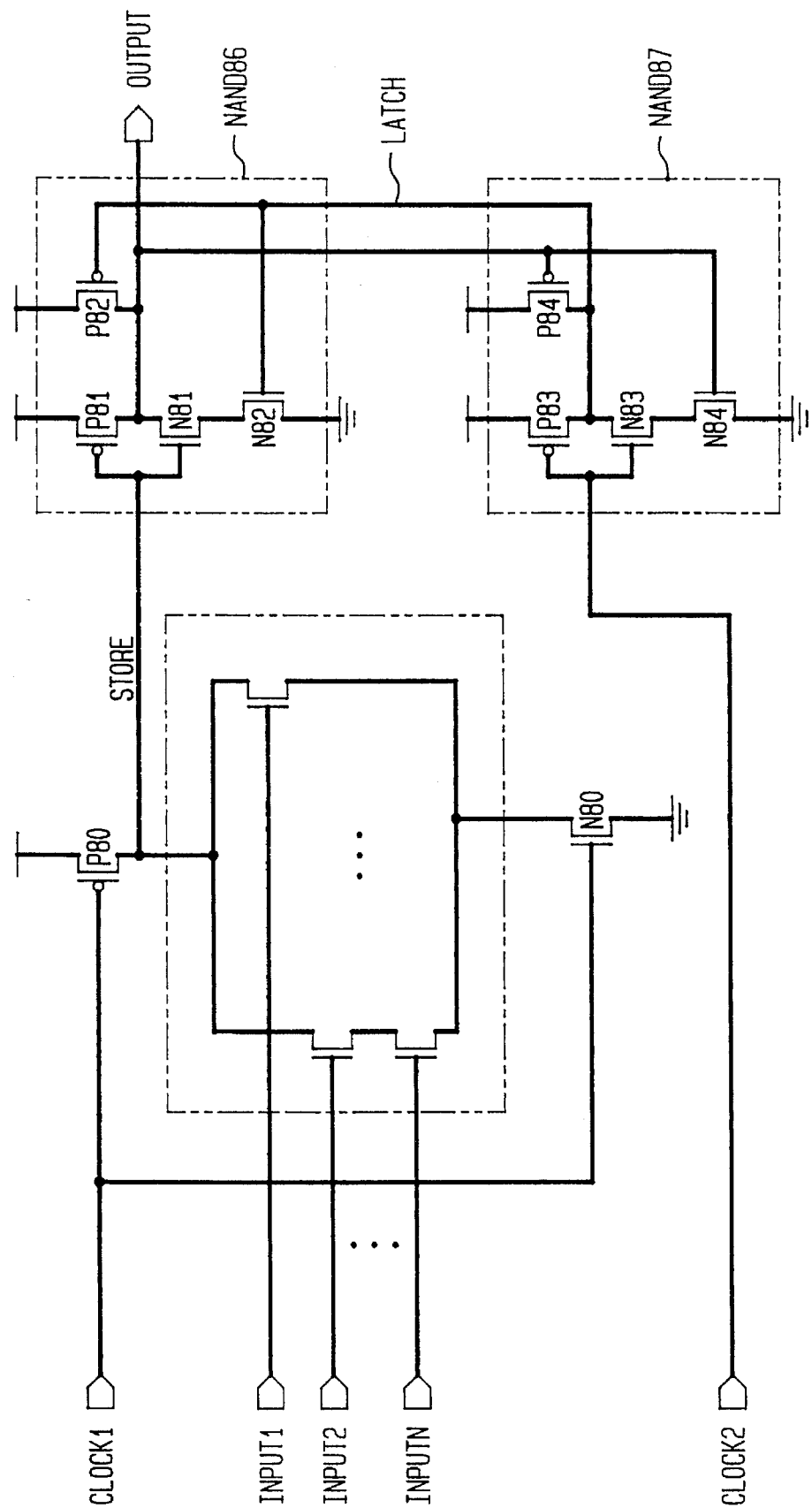
FIG. 8 is a preferred logic-latch in accordance with the present invention.

The first feature merges LAT1 into the last LOG1 stage of FIG. 3 (a). The blocks depicted as LOG1 and LOG2 can perform any logic operation (such as arithmetic operations, processor control, address computation, etc.) without departing from the spirit of the invention. FIG. 8 shows a preferred implementation of such a logic-latch circuit (a CMOS technology example). When 'clock1' = '1' and 'clock2' = '0' node 'latch' is driven to '1' by transistor P83. Under such condition, NAND86 behaves like the inverter I10 of FIG. 1. When 'clock1' = '0' and 'clock2' = '1' node 'store' is precharged to '1' by transistor P80. A person versed in the art of circuit design will recognize that cross-coupled NAND gates NAND86 and NAND87 behave as a latch. For example, if node 'output' is '1' then NAND87 has '1's applied to both of its inputs. This drives node 'latch' to '0'. NAND86 has one of its inputs at '0' (node 'latch') and the other input at '1' ('node store'). The effect is to drive NAND86's output to '1'. This is the initial condition of the circuit. On the other hand, if node 'output' is '0' then NAND87 has one of its inputs at '0' and the other input at '1' (node 'clock2'). This drives node 'latch' to '1'. NAND86 has both of its inputs at '1', which drive NAND86's output to '0'. This is the initial condition of the circuit. This illustrates how cross-coupled NAND gates behave as a latch when both inputs (nodes 'store' and 'clock2') are '1'. Therefore, the circuit of FIG. 8 merges LAT1 into the LOG1 dynamic logic gate.

Figure 1:
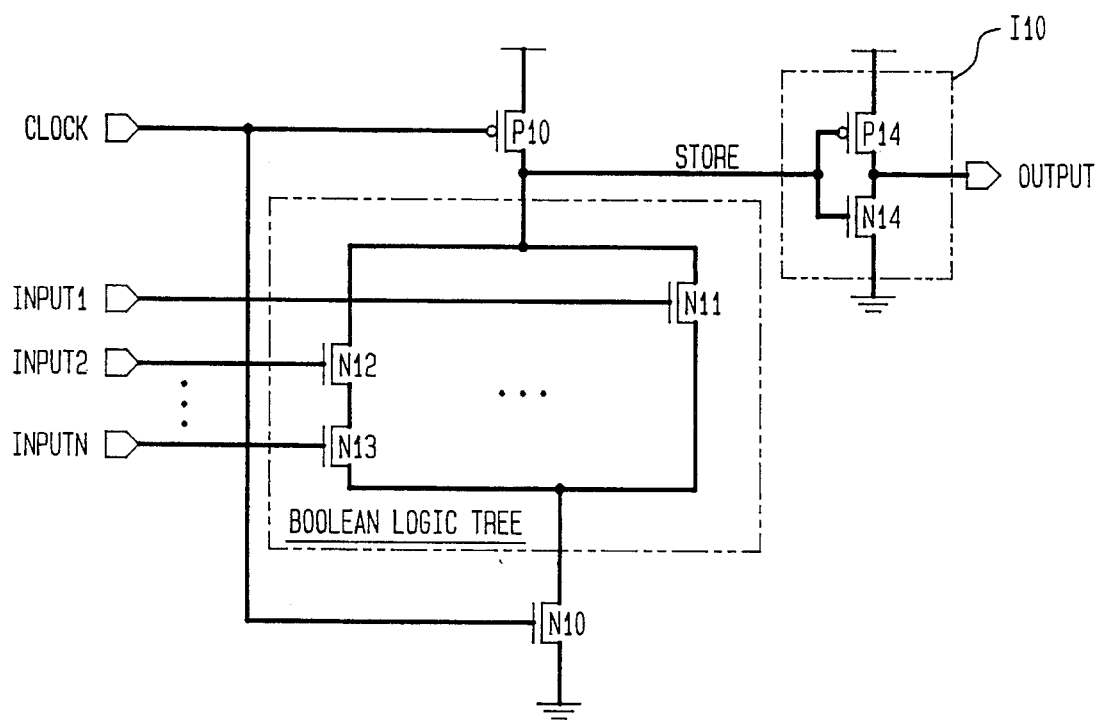
FIG. 1 is an example of a prior art dynamic circuit.
Figure 5:
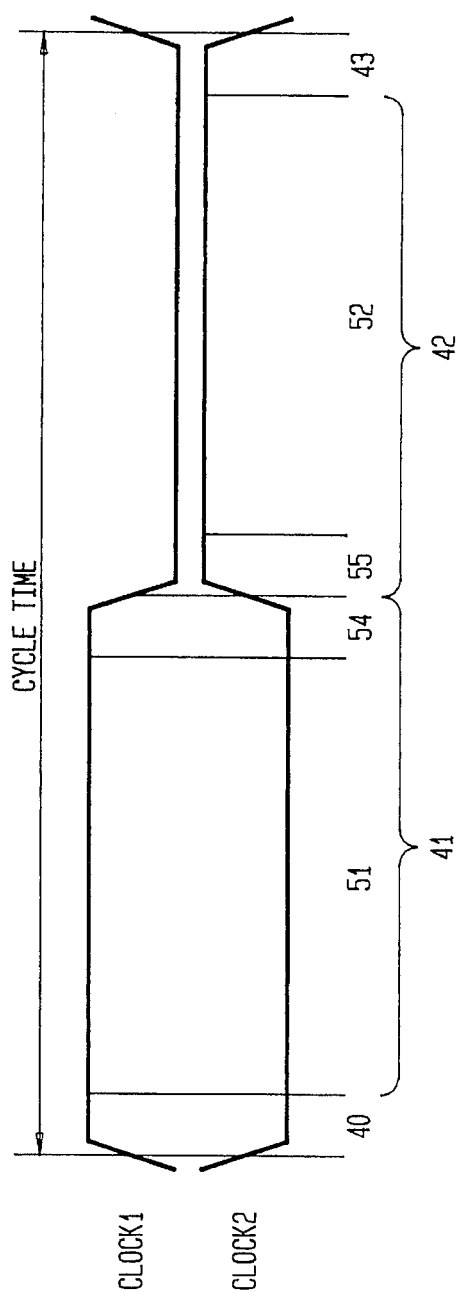
FIG. 5 is a clock signal diagram for the system of FIG. 3 (a) which accounts for latch setup and drive time delays.
Figure 6:
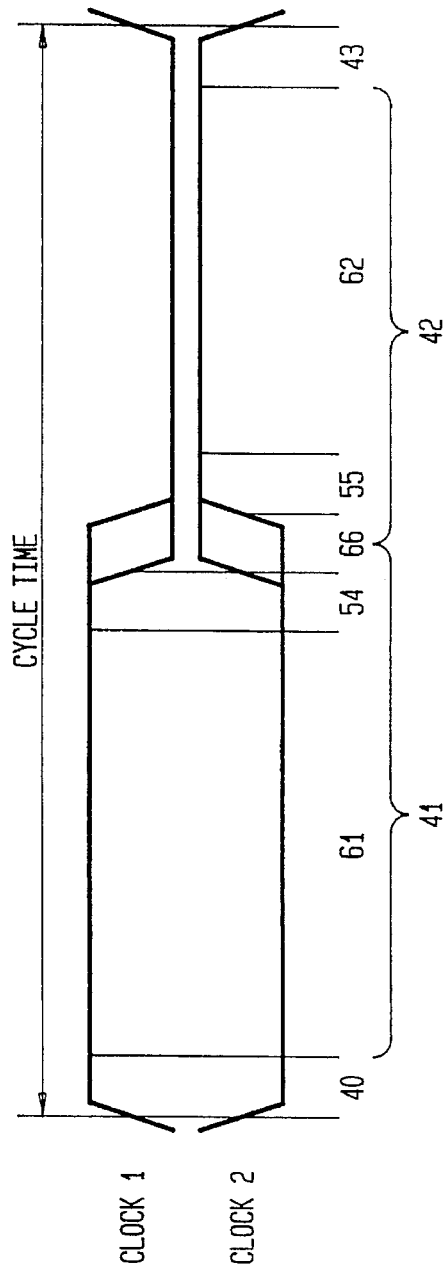
FIG. 6 is a clock signal diagram for the system of FIG. 3 (a) which accounts for mid cycle clock jitter.

The delay of the logic-latch circuit of FIG. 8 is comparable to the delay of the FIG. 1 dynamic gate, which does not have the latch. The reason for this is that in the original dynamic gate of FIG. 1, the critical delay occurs when node 'store' is evaluated to '0' and P14 drives node 'output' to '1'. The circuit of FIG. 8 has a similar critical delay for node 'store' evaluating to '0' and P81 driving node 'output' to '1'. The additional transistors P82 and N82 of FIG. 8, however, have negligible effect on the speed of the circuit. This is because 'clock2', which triggers the latch portion of the logic-latch circuit, is cycled in such a way that it achieves its clocking level of '1' before an edge transition of 'clock1', and maintains that level until after the next edge transition of 'clock1'. By using the combined LOG1/LAT1 circuit it is possible to eliminate the LAT1 setup and LAT1 drive time intervals (54 and 55 of FIG. 5).

Figure 2:
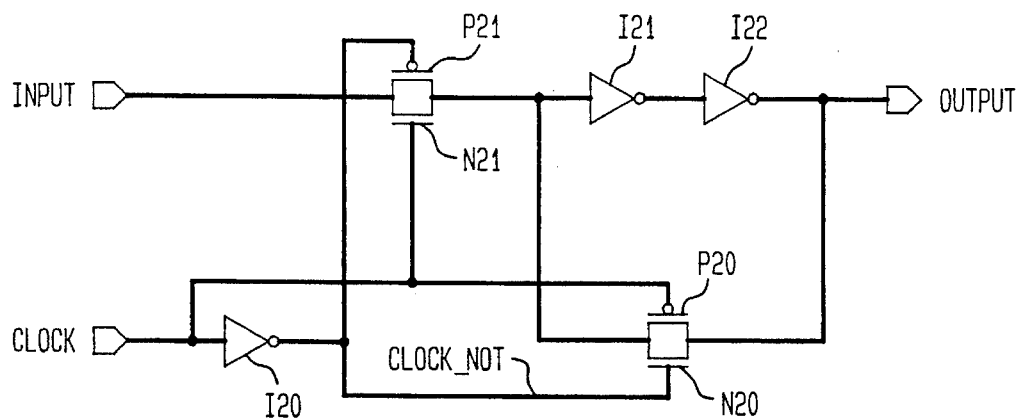
FIG. 2 is a level sensitive latch according to the prior art.
Figure 9:
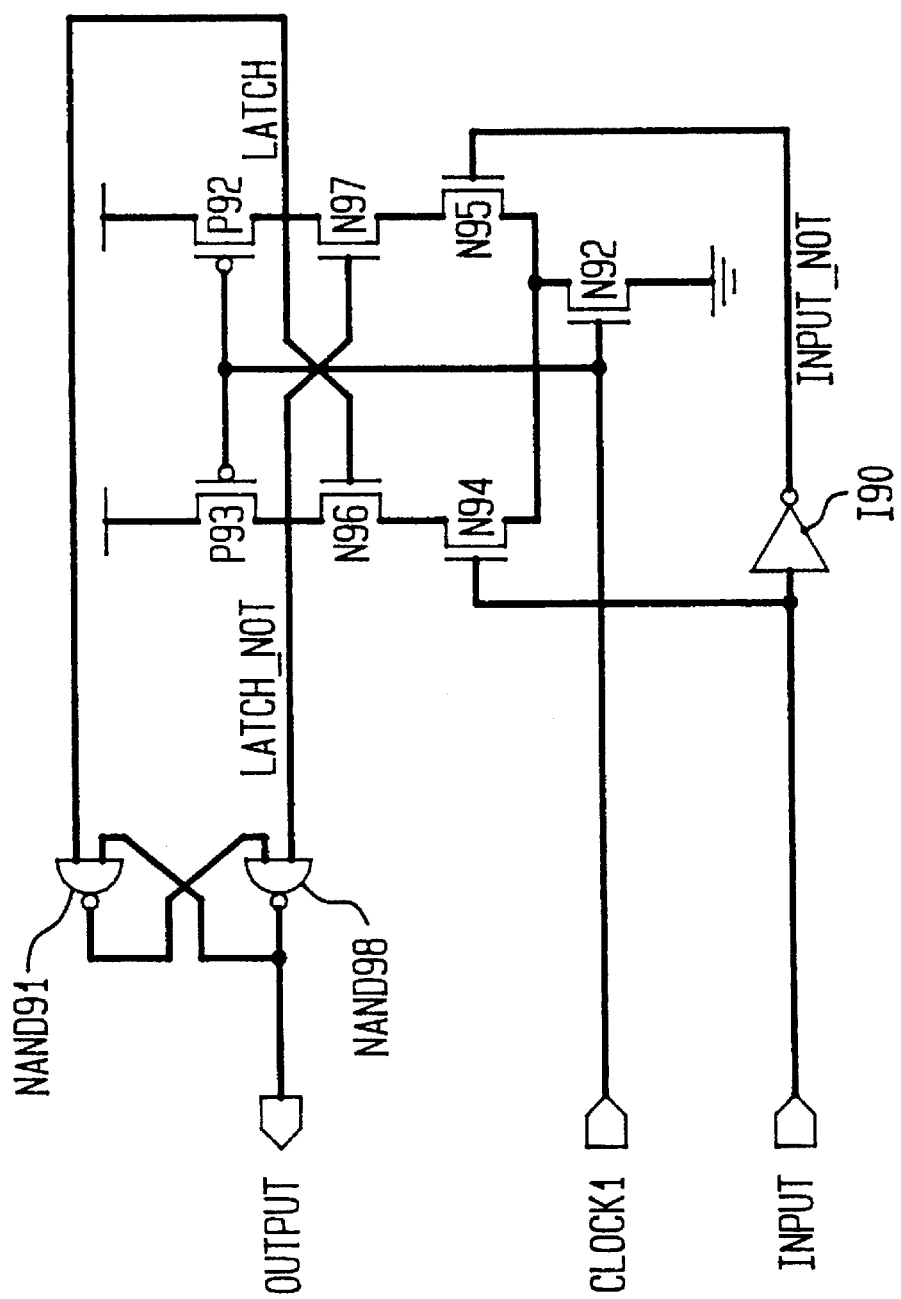
FIG. 9 is a preferred implementation of an edge-triggered latch circuit in accordance with the present invention.

The second feature converts LAT2 (FIG. 3) from a level sensitive latch of FIG. 2 into an edge-triggered latch. An edge-triggered latch samples its input at the rising edge of its clock. After the clock rises, any more changes in the input to the latch do not propagate into the latch. FIG. 9 shows a preferred implementation of such a circuit (a CMOS technology example). When 'clock1' = '0' node 'latch' is precharged to '1' by P92, and node 'latch_not' is precharged to '1' by P93. A person versed in the art of circuit design will recognize that cross-coupled nand gates NAND91 and NAND98 behave as a latch. When 'clock1' goes to '1' while 'input' = '1' then node 'latch_not' is discharged through N96, N94 and N92 to '0'. Once this occurs, even if 'input' changes to '0' causing node 'input not' to become '1' node 'latch' will remain at '1' because N97 is not conducting. When 'clock1' goes to '1' while 'input' = '0' then node 'latch' is discharged through N97, N95 and N92 to '0'. Once this occurs, even if 'input' changes to '1' node 'latch_not' will remain at '1' because N96 is not conducting When 'clock1' goes back to '0' the circuit returns to the initial hold state of the cross-coupled NAND gates, i.e., 'latch' = 'latch_not' = '1'.

Making LAT2 edge-triggered does not by itself allow us to perform more architectured combinational logic. It does, however, allow us to overlap 'clock1' and 'clock2' signals, as described below, because edge-triggered LAT2 prevents races. Overlapping clocks, therefore, lead to better cycle utilization.

Figure 10A:
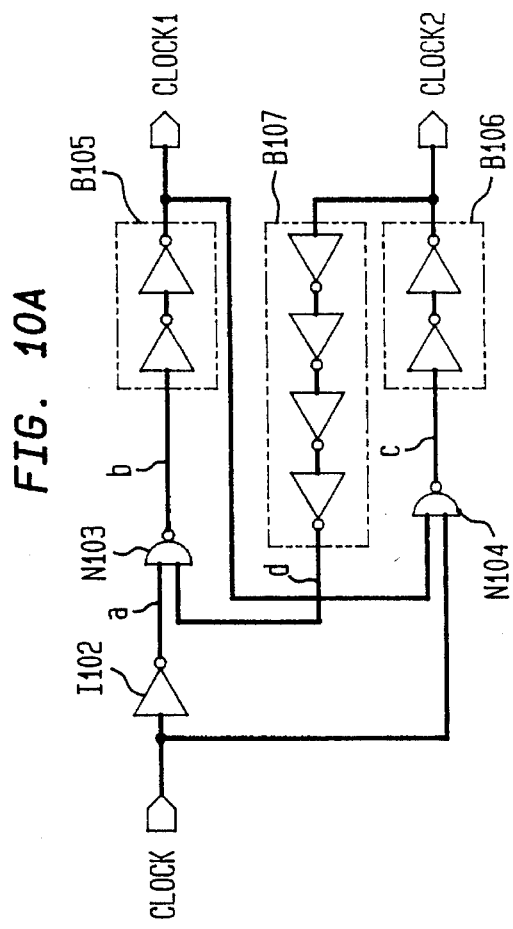
FIG. 10 (a) is a preferred clock circuit in accordance with the invention.
Figure 10B:
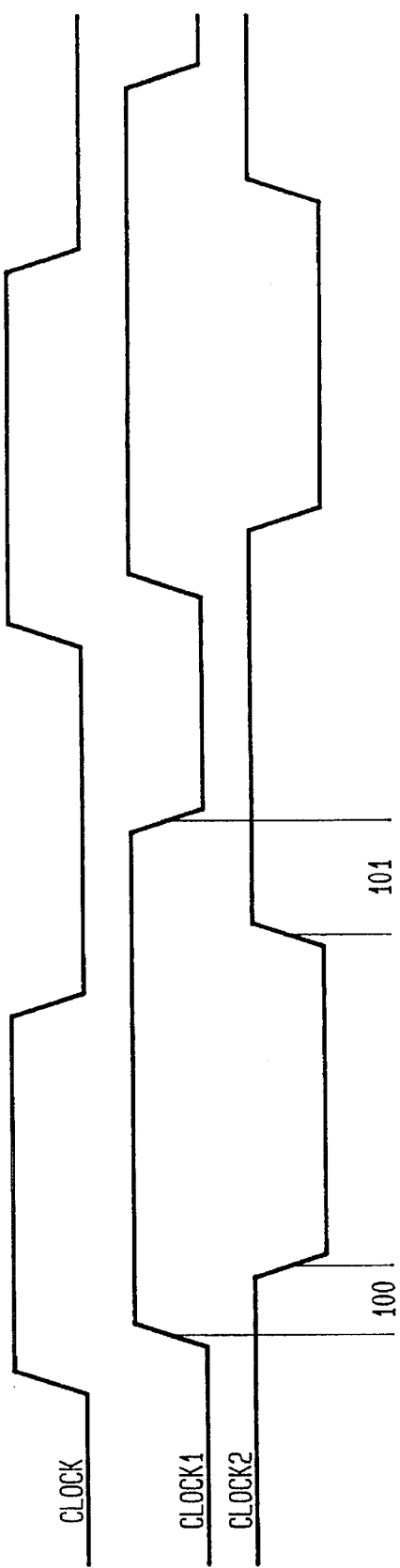

The third feature is a pair of overlapping clocks, 'clock1' and 'clock2', as shown in FIG. 10 (a). As used herein, the term "overlap" means that the clocks each are above 0.5 of the peak clock signal value at the same time. These clocks overlap in timing region 100 and 101, as shown if FIG. 10 (b). The overlapping clocks can be generated either locally in the digital system, or remotely.

FIG. 10 (a) shows a preferred implementation of an overlapping clock generator. A single signal 'clock' is shaped by inverter I102, nand gates N103 and N104, and buffers B105, B106 and B107 (buffers B105, B106, and B107 each comprise an even number of inverters).

Figure 11:
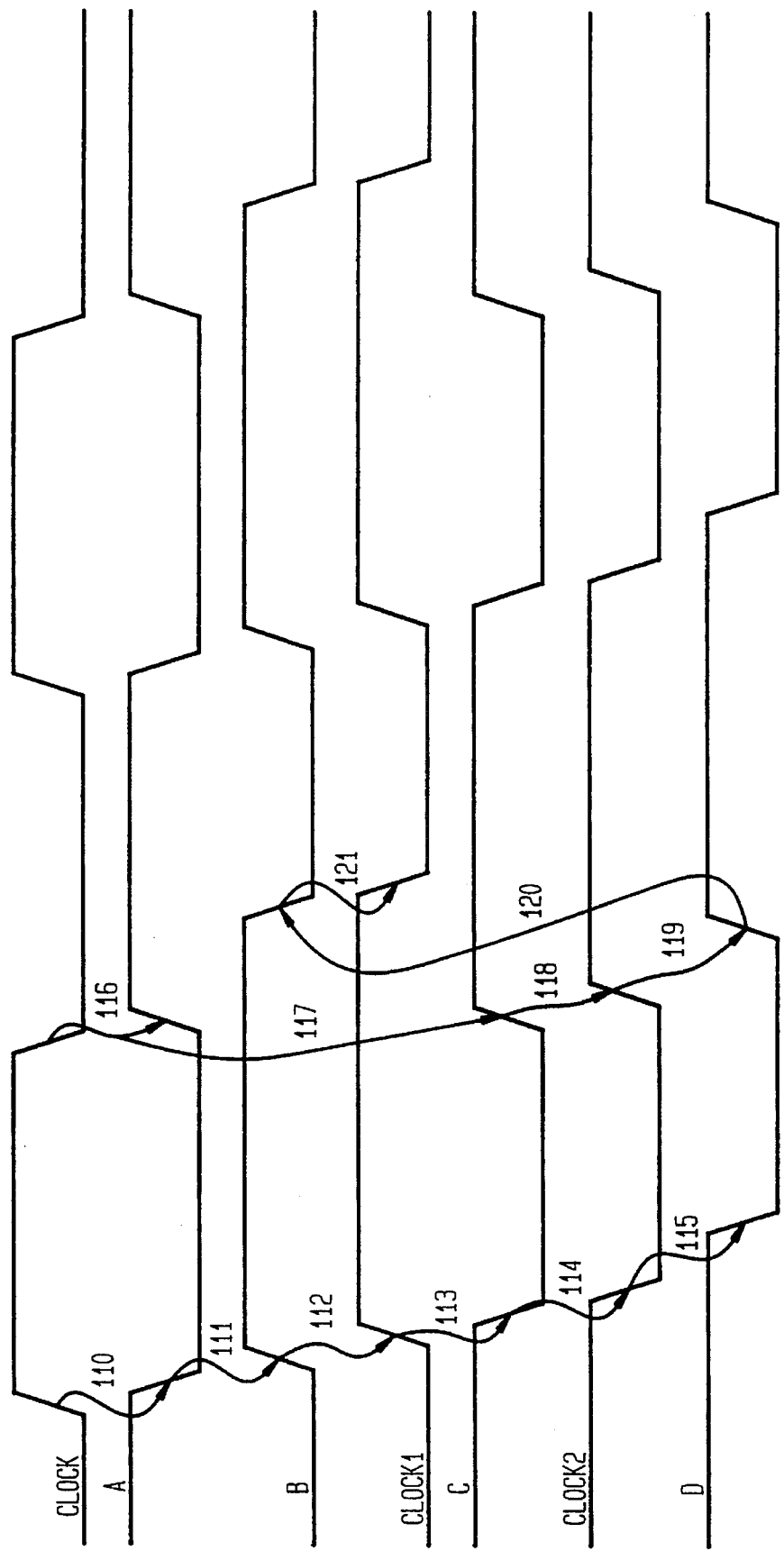
FIG. 11 shows the state of various points in the clock of FIG. 10 (a) as a function of time.

The circuit operation as 'clock' undergoes '0' to '1' transitions is shown in FIG. 11 (with reference to nodes depicted in FIG. 10 (a):
'clock' goes to '1' ; followed by (110)
node 'a' goes to '0'; followed by (111)
node 'b' goes to '1'; followed by (112)
'clock1' goes to '1'; followed by (113)
node 'c' goes to '0'; followed by (114)
'clock2' goes to '0'; followed by (115)
node 'd' goes to '0'.
This sequence produces overlap region 100 of FIG. 10 (b).

The circuit operation as 'clock' undergoes '1' to '0' transitions is also shown in FIG. 11:

'clock' goes to '0'; followed by (116 and 117)
node 'a' goes to '1' and node 'c' goes to '1'; followed by (118)
'clock2' goes to '1'; followed by (119)
node 'd' goes to '1'; followed by (120)
node 'b' goes to '0'; followed by (121)
'clock1' goes to 0.
This sequence produces overlap region 101 of FIG. 10.

Figure 12A:
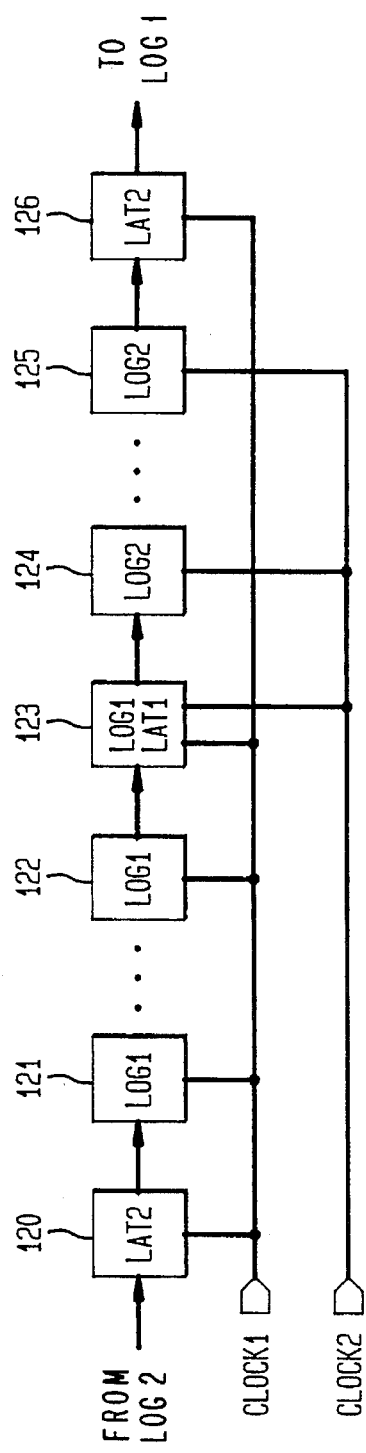
FIG. 12 (a) is a system level diagram of the system of the present invention.
Figure 12B:
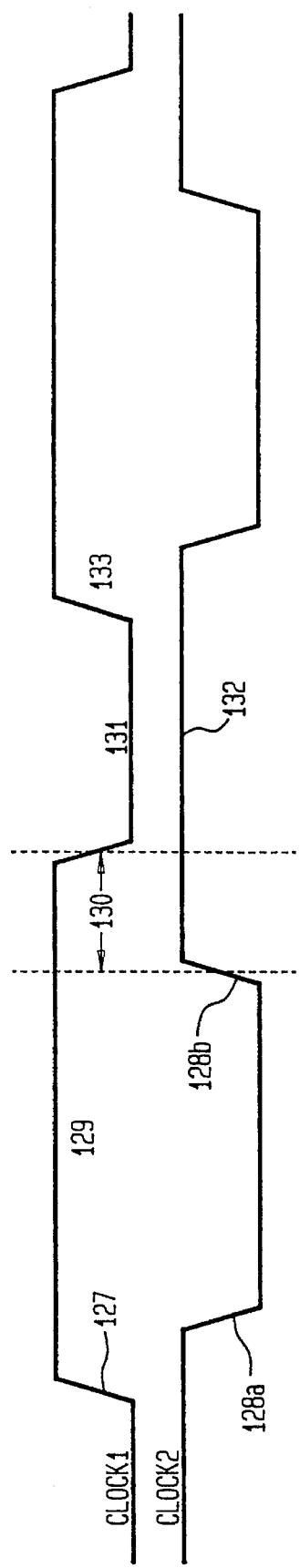

The three features described above are combined to form the digital dynamic system of FIG. 12 (a). LAT2s (120 and 126) are edge-triggered architectured registers. Architectured combinational logic is split between LOG1s (121 ... 122) and LOG2s (124 ... 125). Block 123 is the last stage of LOG1s and contains the logic-latch circuit as described above with respect to FIG. 8. The system of FIG. 12 (a), when driven by the clock signals of FIG. 12 (b), functions as follows. When 'clock1' transitions from '0' to '1' (127 of FIG. 12 (b)), LAT2s capture the data from LOG2s. As long as 'clock1' = '1' (129), LOG1s are performing logic. In the meantime, 'clock2' transitions to '0' (128a), and LOG2s are precharged. When 'clock2' transitions from '0' to '1' (128b), 'clock1' and 'clock2' overlap (130). This state that was illegal in the prior art two-clock clocking scheme (because of racing) is legal now because LAT2s are edge-triggered. Races do not exist since the next time LAT2s will update is at time 133, i.e., when 'clock1' goes from '0' to '1'. When 'clock1' transitions to '0' state (131) LOG1s are precharged. In the meantime, 'clock2' = '1' (132) and LOG2s continue to perform logic. At time 133 'clock1' transitions '0' to '1' again and the cycle is repeated.

Overlap region 130 has both LOG1s and LOG2s active and this in turn allows the digital system to be designed to be insensitive to mid cycle clock jitter and to the discrete nature of the LOG1 delays. This can be achieved by making the overlap region 130 longer then the sum of worst-case mid cycle jitter and the worst-case delay of LOG1 blocks.

FIG. 13 shows how the overlap region between 'clock1' and 'clock2' makes the system insensitive to mid cycle clock jitter. Interval 133 is the time to perform one level of LOG1 logic and interval 134 is the time to perform one level of LOG2 logic. Jitter in 'clock' (130) produces corresponding jitter in 'clock1' (131) and in 'clock2' (132) (after the delays shown in FIG. 11). However this jitter does not interfere with data transfer from LOG1 stage controlled by 'clock1' to LOG2 stage controlled by 'clock2' because when 'clock2' is experiencing jitter at 132, 'clock1' and not 'clock2' is controlling logic elements LOG1's. Similarly, when 'clock1' is experiencing jitter at 131, 'clock2' and not 'clock1' is controlling logic elements LOG2's.

FIGS. 14 (a) and 14 (b) show how the overlap region between 'clock1' and 'clock2' make the system insensitive to the discrete nature of LOG1 delays 142 and LOG2 delays 144. There is a degree of freedom where during the overlap region, data leaves the last LOG1 stage and enters the first LOG2 stage. This is due to the fact that within the overlap region both LOG1 and LOG2 blocks are active (this is not true for the two-clock clocking scheme). Region 140 shows the clock overlap of FIG. 14 (a), and region 144 shows the clock overlap of FIG. 14 (b). In FIG. 14 (a), LOG1 performs less logic than it does in FIG. 14 (b).

Figure 7:
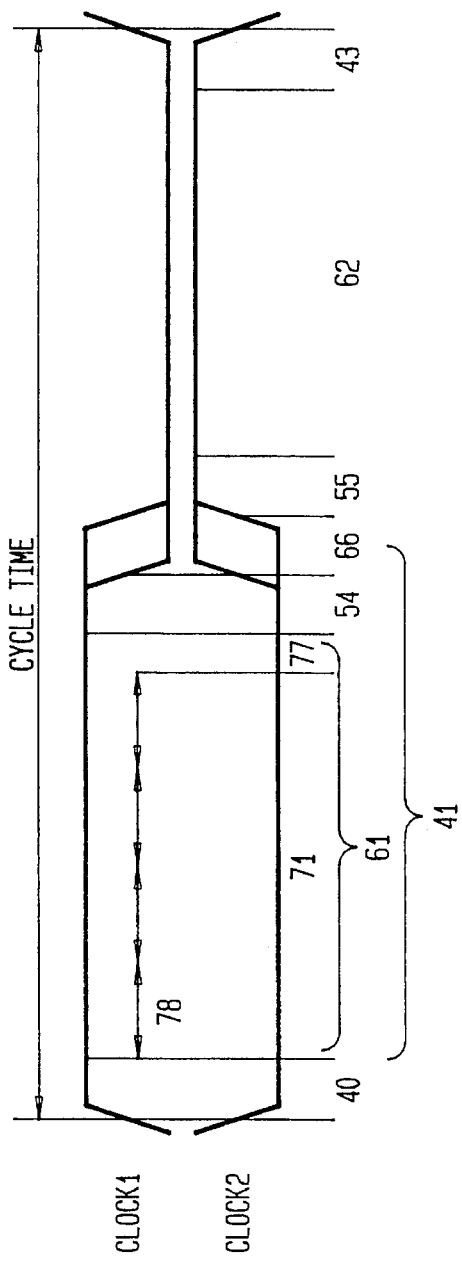
FIG. 7 is a clock signal diagram for the system of FIG. 3 (a) which accounts for lost time due to fractional logic delay.

Thus, FIG. 13 and FIG. 14 show that by using the present invention it is possible to eliminate undesired time intervals 54, 55, 66, and 77 of FIG. 7 by using two-phase overlapping clocking.

I claim:

1. A digital dynamic circuit, comprising:
    a first group of sequentially arranged logic circuits collectively having an input and an output;
    a logic-latch circuit having an input and an output, the input of which is coupled to the output of the first group of logic circuits;
    a second group of sequentially arranged logic circuits collectively having an input and an output, the input of which is coupled to the output of the logic-latch circuit;
    a first latch having an input and an output, the input of which is coupled to the output of the second group of logic circuits, and the output of which is coupled to the input of the first group of logic circuits;
    a first clock signal coupled to provide clock inputs to the logic-latch circuit, the first group of logic circuits and the first latch;
    a second clock signal coupled to provide clock inputs to the second group of logic circuits and to the logic-latch circuit;
    wherein the first and second clock signals overlap.

2. The circuit of claim 1, wherein the logic-latch circuit comprises:
    a logic circuit;
    a second latch coupled to receive an output from the logic circuit;
    wherein the first clock signal acts as the clocking signal for the logic circuit, and wherein the second clock signal acts as the clocking signal for the second latch.

3. The circuit of claim 1, wherein the first latch is edge triggered.

4. The circuit of claim 2, wherein the second latch comprises first and second NAND gates each having a plurality of inputs, the inputs to the first NAND gate being coupled to the output of the logic circuit, the inputs to the second NAND gate being coupled to the output of the second clock signal.

5. The circuit of claim 2, wherein the second latch introduces a substantially smaller delay into the output of the logic circuit of the logic-latch than the logic circuit of the logic-latch introduces into the output of the first group of logic circuits.

6. The circuit of claim 2, wherein the second latch introduces a negligible delay into the output of the logic circuit of the logic-latch.

7. The circuit of claim 1, further comprising a clock circuit having means for generating the first and second clock signals, the means for generating comprising:
    input means for receiving a regular clock input signal;
    means for producing a first irregular output clock signal; and
    means for producing a second irregular shaped clock signal in synch and out of phase with the first clock signal.

8. A digital dynamic system, comprising:
    a first group of sequentially arranged logic circuits collectively having an input and an output;
    a logic-latch circuit having an input and an output, the input of which is coupled to the output of the first group of logic circuits;
    a second group of sequentially arranged logic circuits collectively having an input and an output, the input of which is coupled to the output of the logic-latch circuit;
    an edge-triggered latch having an input and an output, the input of which is coupled to the output of the second group of logic circuits, and the output of which is coupled to the input of the first group of logic circuits;
    a first clock signal coupled to provide clock inputs to the logic-latch circuit, the first group of logic circuits and the edge-triggered latch;

a second clock signal coupled to provide clock inputs to the second group of logic circuits and the logic latch;

wherein the first and second clock signals overlap.

9. The system of claim 8, wherein the logic-latch circuit comprises:

a logic circuit;

a second latch coupled to receive an output from the logic circuit of the logic-latch;

wherein the first clock signal acts as the clocking signal for the logic circuit of the logic latch, and wherein the second clock signal acts as the clocking signal for the second latch.

10. The system of claim 9, wherein the second latch comprises first and second NAND gates each having a plurality of inputs, the inputs to the first NAND gate being coupled to the output of the logic circuit, the inputs to the second NAND gate being coupled to the output of the second clock signal.

11. The system of claim 8, further comprising a clock circuit having means for generating the first and second clock signals, the means for generating comprising:

input means for receiving a regular clock input signal;

means for producing a first irregular output clock signal; and means for producing a second irregular shaped clock signal in synch and out of phase with the first clock signal.

12. A digital dynamic system, comprising:

a first group of sequentially arranged logic circuits collectively having an input and an output;

a logic-latch circuit having an input and an output, the input of which is coupled to the output of the first group of logic circuits;

a second group of sequentially arranged logic circuits collectively having an input and an output, the input of which is coupled to the output of the logic-latch circuit;

an edge-triggered latch having an input and an output, the input of which is coupled to the output of the second group of logic circuits, and the output of which is coupled to the input of the first group of logic circuits;

a clock circuit having means for generating a first clock signal to provide clock inputs to the first group of logic circuits and a second clock signal to provide clock inputs to the second group of logic circuits and the logic latch circuit, comprising:

input means for receiving a regular clock input signal;

means for producing a first irregular output clock signal; and means for producing a second irregular shaped clock signal in synch and out of phase with the first clock signal;

wherein the first and second clock signals overlap.

13. The system of claim 12, wherein the logic-latch circuit comprises:

a logic circuit;

a second latch coupled to receive an output from the logic circuit;

wherein the first clock signal acts as the clocking signal for the logic circuit and wherein the second clock signal acts as the clocking signal for the second latch.

14. The system of claim 13, wherein the second latch comprises first and second NAND gates each having a plurality of inputs, the inputs to the first NAND gate being coupled to the output of the logic circuit, the inputs to the second NAND gate being coupled to the output of the second clock signal.

* * * * *